United States Patent [19]

Johnston et al.

[11] Patent Number: 5,227,788

[45] Date of Patent: Jul. 13, 1993

[54] METHOD AND APPARATUS FOR TWO-COMPONENT SIGNAL COMPRESSION

[75] Inventors: James D. Johnston, Warren; James A. Reeds, III, New Providence, both of N.J.

[73] Assignee: AT&T Bell Laboratories, Murray Hill, N.J.

[21] Appl. No.: 844,809

[22] Filed: Mar. 2, 1992

[51] Int. Cl.[5] ............................................. H03M 7/46
[52] U.S. Cl. ......................................... 341/63; 341/65
[58] Field of Search .................... 341/63, 64, 65, 67, 341/95

[56] References Cited

U.S. PATENT DOCUMENTS 4,796,003  1/1989  Bentley et al. ...................... 341/95

OTHER PUBLICATIONS

P. Elias, "Universal Codeword Sets and Representations of the Integers," *IEEE Trans. Inf. Theory*, vol. IT-21, No. 2, 194-203 (Mar. 1975).

J. L. Bentley and A. C. Yao, "An Almost Optimal Algorithm for Unbounded Searching," Info. Proc. Letters, vol. 5, No. 3, 82-87 (Aug. 1976).

T. C. Bell, J. G. Cleary, I. H. Witten, *Text Compression*, 290-295 (1990).

J. Ziv and A. Lempel, "A Universal Algorithm for Sequential Data Compression," *IEEE Trans. Info. Theory*, IT-23, 337-343 (1977).

D. A. Huffman, "A Method for the Construction of Minimum-Redundancy Codes," *Proc. IRE*, 40:1098-1101 (1952).

T. M. Cover and J. A. Thomas, *Elements of Information Theory*, pp. 92-101 (1991).

Primary Examiner—Marc S. Hoff
Attorney, Agent, or Firm—Jason Paul DeMont

[57] ABSTRACT

A method and apparatus for compressing and expanding discrete signals is disclosed which comprises two compression methods which interact synergistically. Illustratively, a minimum-redundancy Huffman code, which partially represents a compressed signal, is used in conjunction with a uniquely decodable code which comprises two components. The first component represents its own length, the length of the second component and partially represents the compressed signal and the second component partially represents the compressed signal.

14 Claims, 3 Drawing Sheets

METHOD AND APPARATUS FOR TWO-COMPONENT SIGNAL COMPRESSION

CROSS-REFERENCE TO RELATED APPLICATIONS AND MATERIALS

The following U.S. patent applications filed concurrently with the present application and assigned to the assignee of the present application are related to the present application and each is hereby incorporated herein as if set forth in its entirety: "A METHOD AND APPARATUS FOR THE PERCEPTUAL CODING OF AUDIO SIGNALS," by A. Ferreira and J. D. Johnston; "A METHOD AND APPARATUS FOR CODING AUDIO SIGNALS BASED ON PERCEPTUAL MODEL," by J. D. Johnston; and "RATE LOOP PROCESSOR FOR PERCEPTUAL ENCODER/DECODER," by J. D. Johnston.

FIELD OF THE INVENTION

The present invention relates to signal compression in general, and more particularly, to the efficient encoding and decoding of audio, video and other signals.

BACKGROUND OF THE INVENTION

Many methods for the lossless compression of discrete signals exist. The minimum-redundancy Huffman compression method, for example, is useful when the set of distinct possible input signals is small enough to allow use of a convenient "codebook" and the statistical distribution of the input signals is known in advance. D. A. Huffman, "A Method for the Construction of Minimum Redundancy Codes", *Proc. IRE*, 40:1098-1101 (1952) and T. M. Cover and J. A. Thomas, *Elements of Information Theory*, pp.92-101 (1991). Huffman does not, however, teach a method for compression in situation where the codebook becomes unmanageably large (because of the large number of possible input signals) or when the statistical distribution of the input signals is not known in advance (in which case the codebook cannot be composed to provide efficient encoding).

Another method, taugh by Lempel and Ziv, does not require that the statistical distribution of the input signals be known in advance, but requires more computation and memory than may be desirable for some applications. J. Ziv and A. Lempel, "A Universal Algorithm for Sequential Data Compression," *IEEE Trans. Info. Theory*, IT-23, 337-343 (1977).

Yet another method, taught by Bentley and Yao and also by Elias, provides for compressing signals of arbitrary magnitude by forming compressed signals which comprises a variable length header and a variable length payload. The header is uniquely decodable and represents the length of the payload. The payload represents the uncompressed signal. J. L. Bentley and A. C. Yao, "An Almost Optimal Algorithm for Unbounded Searching," Info. Proc. Letters, Vol. 5, No. 3, 82-87 Aug. 1976); J. L. Bentley et al, U.S. Pat. No. 4,796,003, issued Jan. 3, 1989; P. Elias, "Universal Codeword Sets and Representations of the Integers," *IEEE Trans. Info. Theory*, Vol. IT-21, No. 2, 194-203 Mar. 1975).

SUMMARY OF THE INVENTION

The present invention provides a method and apparatus for the compression of signals while avoiding many of the costs and restrictions associated with prior methods. The compression conducted pursuant to the present invention obviates the need for inconveniently large codebooks.

The results are obtained in an illustrative embodiment of the present invention in which one compression mechanism is used in conjunction with a second compression mechanism such that the second compression mechanism generates a signal which comprises two components. The first component represents its own length, the length of the second component and partially represents the compressed signal and the second component partially represents the compressed signal.

DETAILED DESCRIPTION

1. Overview

Figure 1:
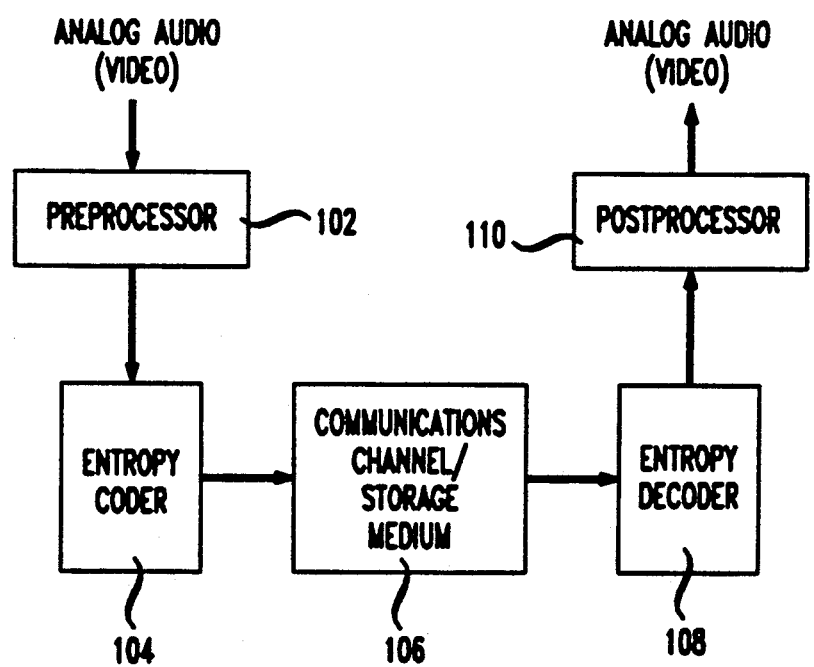
FIG. 1 presents an illustrative audio communication/storage system according to the present invention.

FIG. 1 of the present application discloses the overall organization of a system incorporating the present invention. In that figure, an analog audio signal is fed into preprocessor 102 where it is sampled (typically at 48 KHz) and converted into a quantized audio signal (with typically $2^{16}$ discrete magnitudes) in standard fashion. It will be clear to persons having ordinary skill in the art of data compression how to modify the illustrative embodiment of the present invention to process video or other kinds of analog and digital signals.

The quantized audio signal is fed into entropy coder 104. Entropy coder 104 encodes the quantized audio signal, creates a compressed audio signal representing the quantized audio signal, and outputs the compressed audio signal to communications channel/storage medium 106. From communications channel/storage medium 106 the compressed audio signal is fed into entropy decoder 108. Entropy decoder 108 decodes the compressed audio signal, creates a reconstructed audio signal which is representative of the compressed audio signal, and outputs the reconstructed audio signal to post-processor 110. Post-processor 110 creates a reconstructed analog signal which is representative of the reconstructed audio signal and outputs the reconstructed audio signal.

For the purpose of clarity, the illustrative embodiments encode and decode one quantized audio signals per compressed audio signal. It will be clear to persons having ordinary skill in the field of data communications how to encode pairs, triples, etc. of quantized audio signals into a single compressed audio signal.

2. The Entropy Coder

Entropy coder 104, in accordance with the present invention, advantageously inputs a "quantized audio signal" output from preprocessor 102, performs a "lossless" encoding on the quantized audio signal, and outputs a "compressed audio signal" to the communications channel/storage medium 106. Entropy coder 104 encodes each quantized audio signal so that the quantized audio signal can be transmitted over a more narrow bandwidth channel or stored in less memory than would otherwise be possible.

For clarity of explanation, illustrative embodiments of the present invention are presented as comprising electronic digital circuitry comprising transistor-transistor logic ("TTL"). The functions these circuits provide may alternately be provided by either shared or dedicated hardware, including, but not limited to, hardware capable of executing software. Illustrative embodiments may comprise digital signal processor (DSP) hardware, such as the AT&T DSP16 or DSP32C, and software performing the operations discussed below. Very large scale integration (VLSI) hardware embodiments of the present invention, as well as hybrid DSP/VLSI embodiments, may also be fabricated.

Illustrative entropy coder 104 advantageously comprises a variation of the Huffman coding technique in conjunction with a uniquely decodable code to encode each quantized audio signal. It will be clear to persons of ordinary skill in the data communications field how to fabricate embodiments of the present invention which use other data compression techniques such as Lempel-Ziv.

Although, from a signal processing perspective, it is desirable to encode each quantized audio signal using Huffman's technique, when each quantized audio signal has a large range of potential values and when the probability distribution of each quantized audio signal is highly non-uniform, Huffman's technique necessitates a codebook with more entries than may be desirable for some applications. TABLE 1 shows an illustrative probability distribution of a quantized audio signal where the quantized audio signal has a range of from $-2^{10}$ to, but not including, $+2^{10}$.

TABLE 1

Quantized Audio Signal Probability Distribution

| Quantized Audio Signal | Quantized Audio Signal Probability | Huffman Code Signal | | |
|---|---|---|---|---|
| $+15<n<+2^{10}$ | .043 | 111 | 00 | |
| 15 | .033 | 100 | 01 | |
| 14 | .027 | 010 | 01 | |
| 13 | .043 | 111 | 01 | |
| 12 | .033 | 100 | 10 | |
| 11 | .033 | 100 | 11 | |
| 10 | .036 | 101 | 11 | |
| 9 | .045 | 000 | 0 | |
| 8 | .042 | 110 | 11 | |
| 7 | .045 | 000 | 1 | |
| 6 | .043 | 111 | 10 | |
| 5 | .046 | 001 | 0 | |
| 4 | .056 | 010 | 1 | |
| 3 | .056 | 011 | 0 | |
| 2 | .049 | 001 | 1 | |
| 1 | .074 | 110 | 0 | |
| 0 | .068 | 101 | 0 | |
| −1 | .028 | 011 | 10 | |
| −2 | .020 | 110 | 101 | |
| −3 | .030 | 100 | 00 | |
| −4 | .022 | 111 | 111 | |
| −5 | .019 | 110 | 100 | |
| −6 | .012 | 010 | 001 | |
| −7 | .013 | 011 | 110 | |
| −8 | .022 | 111 | 110 | |
| −9 | .018 | 101 | 101 | |
| −10 | .016 | 011 | 111 | |
| −11 | .030 | 101 | 100 | 111 |
| −12 | .011 | 010 | 000 | |
| −13 | .030 | 101 | 100 | 110 |
| −14 | .070 | 101 | 100 | 0 |
| −15 | .030 | 101 | 100 | 101 |
| $-2^{10}\leq n<-15$ | .010 | 101 | 100 | 100 |

The probability distribution indicates that although the quantized audio signal has a range of from $-2^{10}$ to, but not including, $+2^{10}$, the quantized audio signal tends to occur between −15 and +15. It will be clear to those having ordinary skill in the art how to fabricate embodiments of the invention which have other ranges, other probability distributions, and/or probability distributions not symmetric around zero. From this probability distribution, using Huffman's technique, a set of variable-length "Huffman code signals" can be created which efficiently represent some of the quantized audio signals. Column 3 of TABLE 1 presents an illustrative set of Huffman code signals corresponding to each quantized audio signal.

Note, in accordance with the illustrative embodiment, the compressed audio signal output from entropy coder 104 may comprise one of the 33 "definitive Huffman code signals" which uniquely corresponds to one of the 33 quantized audio signals from −15 to ≦+15 inclusive. Alternately, and also in accordance with the illustrative embodiment of the present invention, the compressed audio signal may comprise one of two "indefinite Huffman code signals" and an "auxiliary code signal" which together uniquely represent a quantized audio signal. Note that there is advantageously only one indefinite Huffman code signal ("11100") corresponding to all ($2^{10}$–15) of the quantized audio signals in excess of +15 and only one indefinite Huffman code signal ("101100100") corresponding to all ($2^{10}$–14) of the quantized audio signals below −15.

Figure 2:
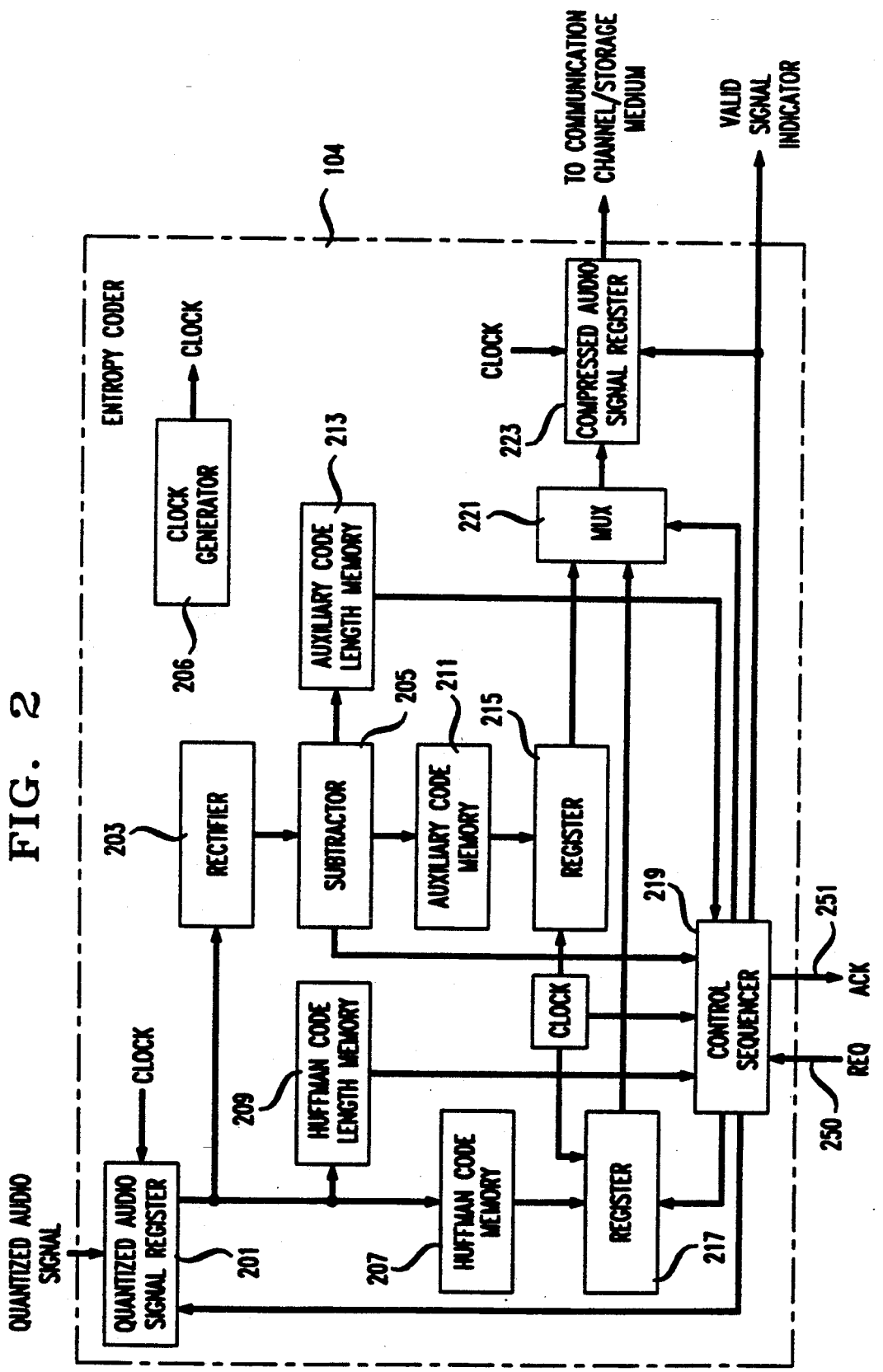
FIG. 2 presents an illustrative entropy coder according to the present invention.

As is shown in FIG. 2, an illustrative entropy coder 104 in accordance with the present invention advantageously comprises sequential and combinatorial digital circuitry. All of the sequential circuitry within entropy coder 104 is synchronously clocked on the clock signal's positive edge as generated by clock generator 206.

When entropy coder 104 is ready to accept a quantized audio signal from preprocessor 102, control sequencer 219 asserts ACK 251. Control sequencer 219 illustratively comprises combinatorial digital circuitry and sequential circuitry. It will be clear to persons having ordinary skill in the art of data communications how to fabricate control sequencer 219.

When preprocessor 102 desires to transmit a quantized audio signal to entropy coder 104 and ACK 251 is currently asserted, preprocessor 102 presents an 11-bit two's complement quantized audio signal to quantized audio signal register 201 and asserts REQ 250. Quantized audio signal register 201 is advantageously a parallel-in/parallel-out register (e.g., two SN74199 ICs) comprising memory sufficient to hold all 11 binary signals of the quantized audio signal.

When control sequencer 219 is ready to begin processing the quantized audio signal, control sequencer 219 synchronously enables quantized audio signal register 201 to load the quantized audio signal and retracts ACK 251 to indicate to preprocessor 102 that entropy coder 104 has accepted the quantized audio signal for processing. In recognition of sensing the retraction of ACK 251, preprocessor 102 retracts REQ 250.

The quantized audio signal from quantized audio signal register 201 is fed into the address port of Huffman code memory 207 where the corresponding output (i.e., the Huffman code signal) is, under the direction of control sequencer 219, loaded into register 217. Huffman code memory 207 is illustratively a 2048-word by 9-bit random access memory ("RAM") or ROM. The contents of Huffman code memory 207 are shown in TABLE 2.

TABLE 2

Huffman Code Memory Contents (Encoder)

| Address | | | | Contents | | |
|---|---|---|---|---|---|---|
| 01 | XXX | XXX | XXX | 111 | 00Y | YYY |
| 0X | 1XX | XXX | XXX | 111 | 00Y | YYY |
| 0X | X1X | XXX | XXX | 111 | 00Y | YYY |
| 0X | XX1 | XXX | XXX | 111 | 00Y | YYY |
| 0X | XXX | 1XX | XXX | 111 | 00Y | YYY |
| 0X | XXX | X1X | XXX | 111 | 00Y | YYY |
| 00 | 000 | 001 | 111 | 100 | 01Y | YYY |
| 00 | 000 | 001 | 110 | 010 | 01Y | YYY |
| 00 | 000 | 001 | 101 | 111 | 01Y | YYY |
| 00 | 000 | 001 | 100 | 100 | 10Y | YYY |
| 00 | 000 | 001 | 011 | 100 | 11Y | YYY |
| 00 | 000 | 001 | 010 | 101 | 11Y | YYY |
| 00 | 000 | 001 | 001 | 000 | 0YY | YYY |
| 00 | 000 | 001 | 000 | 110 | 11Y | YYY |
| 00 | 000 | 000 | 111 | 000 | 1YY | YYY |
| 00 | 000 | 000 | 110 | 111 | 10Y | YYY |
| 00 | 000 | 000 | 101 | 001 | 0YY | YYY |
| 00 | 000 | 000 | 100 | 010 | 1YY | YYY |
| 00 | 000 | 000 | 011 | 011 | 0YY | YYY |
| 00 | 000 | 000 | 010 | 001 | 1YY | YYY |
| 00 | 000 | 000 | 001 | 110 | 0YY | YYY |
| 00 | 000 | 000 | 000 | 101 | 0YY | YYY |
| 11 | 111 | 111 | 111 | 011 | 10Y | YYY |
| 11 | 111 | 111 | 110 | 110 | 101 | YYY |
| 11 | 111 | 111 | 101 | 100 | 00Y | YYY |
| 11 | 111 | 111 | 100 | 111 | 111 | YYY |
| 11 | 111 | 111 | 011 | 110 | 100 | YYY |
| 11 | 111 | 111 | 010 | 010 | 001 | YYY |
| 11 | 111 | 111 | 001 | 011 | 110 | YYY |
| 11 | 111 | 111 | 000 | 111 | 110 | YYY |
| 11 | 111 | 110 | 111 | 101 | 101 | YYY |
| 11 | 111 | 110 | 110 | 011 | 111 | YYY |
| 11 | 111 | 110 | 101 | 101 | 100 | 111 |
| 11 | 111 | 110 | 100 | 010 | 000 | YYY |
| 11 | 111 | 110 | 011 | 101 | 100 | 110 |
| 11 | 111 | 110 | 010 | 101 | 100 | 0YY |
| 11 | 111 | 110 | 001 | 101 | 100 | 101 |
| 11 | 111 | 110 | 000 | 101 | 100 | 100 |
| 10 | XXX | XXX | XXX | 101 | 100 | 100 |
| 1X | 0XX | XXX | XXX | 101 | 100 | 100 |
| 1X | X0X | XXX | XXX | 101 | 100 | 100 |
| 1X | XX0 | XXX | XXX | 101 | 100 | 100 |
| 1X | XXX | 0XX | XXX | 101 | 100 | 100 |
| 1X | XXX | X0X | XXX | 101 | 100 | 100 |

As shown in Table 2, an "X" in an address indicates that the address is valid for "X" equal to both "0" and "1" (e.g., address 01 XXX XXX XXX means all 2⁹ addresses between 01 000 000 000 and 01 111 111 111). The Huffman code signal has a variable length although each memory location in Huffman code memory 207 has a fixed length. To permit the Huffman code signal to be delimited and defined within the fixed Huffman code memory 207 word width, a "Y" represents a memory cell location which is not a part of the Huffman code signal.

Register 217 is advantageously a parallel-in/serial-out register (e.g., two SN74166 ICs) comprising memory sufficient to hold all 9 binary signals of the Huffman code signal output from Huffman code memory 207. The Huffman code signal is loaded into register 217 such that the most significant binary signals of the Huffman code signal will be serially shifted out of register 217 first.

Because the Huffman code signal has a variable length, the illustrative embodiment advantageously comprises a mechanism for informing control sequencer 219 of the length of the Huffman code signal corresponding to the quantized audio signal being processed. As shown in FIG. 2, the quantized audio signal from quantized audio signal register 201 is fed into the address port of Huffman code length memory 209 where the corresponding output, the "Huffman code length" is received by control sequencer 219. The Huffman code length indicates the length of the Huffman code signal held in register 217 and thus permits the variable length Huffman code signal to be properly parsed from the 9-bit fixed length memory word. Huffman code length memory 209 is illustratively a 2048 word by 4-bit random access memory ("RAM") or ROM. The contents of Huffman code length memory 209 are shown in TABLE 3.

TABLE 3

Huffman Code Length Memory Contents (Encoder)

| Address | | | | Contents |
|---|---|---|---|---|
| 01 | XXX | XXX | XXX | 5 |
| 0X | 1XX | XXX | XXX | 5 |
| 0X | X1X | XXX | XXX | 5 |
| 0X | XX1 | XXX | XXX | 5 |
| 0X | XXX | 1XX | XXX | 5 |
| 0X | XXX | X1X | XXX | 5 |
| 00 | 000 | 001 | 111 | 5 |
| 00 | 000 | 001 | 110 | 5 |
| 00 | 000 | 001 | 101 | 5 |
| 00 | 000 | 001 | 100 | 5 |
| 00 | 000 | 001 | 011 | 5 |
| 00 | 000 | 001 | 010 | 5 |
| 00 | 000 | 001 | 001 | 4 |
| 00 | 000 | 001 | 000 | 5 |
| 00 | 000 | 000 | 111 | 4 |
| 00 | 000 | 000 | 110 | 5 |
| 00 | 000 | 000 | 101 | 4 |
| 00 | 000 | 000 | 100 | 4 |
| 00 | 000 | 000 | 011 | 4 |
| 00 | 000 | 000 | 010 | 4 |
| 00 | 000 | 000 | 001 | 4 |
| 00 | 000 | 000 | 000 | 4 |
| 11 | 111 | 111 | 111 | 5 |
| 11 | 111 | 111 | 110 | 6 |
| 11 | 111 | 111 | 101 | 5 |
| 11 | 111 | 111 | 100 | 6 |
| 11 | 111 | 111 | 011 | 6 |
| 11 | 111 | 111 | 010 | 6 |
| 11 | 111 | 111 | 001 | 6 |
| 11 | 111 | 111 | 000 | 6 |
| 11 | 111 | 110 | 111 | 6 |
| 11 | 111 | 110 | 110 | 6 |
| 11 | 111 | 110 | 101 | 9 |
| 11 | 111 | 110 | 100 | 6 |
| 11 | 111 | 110 | 011 | 9 |
| 11 | 111 | 110 | 010 | 7 |
| 11 | 111 | 110 | 001 | 9 |
| 11 | 111 | 110 | 000 | 9 |
| 10 | XXX | XXX | XXX | 9 |
| 1X | 0XX | XXX | XXX | 9 |
| 1X | X0X | XXX | XXX | 9 |
| 1X | XX0 | XXX | XXX | 9 |
| 1X | XXX | 0XX | XXX | 9 |
| 1X | XXX | X0X | XXX | 9 |

As shown in Table 2, an "X" in an address indicates that the address is valid for "X" equal to both "0" and "1" (e.g., address 01 XXX XXX XXX means all 2⁹ addresses between 01 000 000 000 and 01 111 111 111). It will be clear to persons having ordinary skill in the art of data communications how to take the address contents, given in decimal notation, and convert them into a binary representation suitable for reception by control sequencer 219.

Because Huffman code memory 207 holds both indefinite and definitive Huffman code signals, the illustrative embodiment advantageously comprises a mechanism for indicating to control sequencer 219 whether the Huffman code signal corresponding to the current quantized audio signal is indefinite or definitive, and when indefinite creates an appropriate auxiliary code signal. Because definitive Huffman code signals exist for quantized audio signals between −15 and +15, inclusive, the illustrative embodiment comprises rectifier 203 and subtractor 205 which together determine when the quantized audio signal is within that range. Rectifier 203 and subtractor 205 accomplish this test by evaluating e: the magnitude of the "diminished audio signal" as described below. As shown in FIG. 2, the quantized audio signal from quantized audio signal register 201 is fed into rectifier 203 which converts the two's complement representation of the quantized audio signal into a 12-bit "rectified audio signal" equal to the absolute value of the quantized audio signal. Rectifier 203 illustratively comprises combinatorial digital circuitry (e.g., three SN74188s).

The rectified audio signal output from rectifier 203 is fed into subtractor 205 which diminishes the rectified audio signal by sixteen quanta to form a "diminished audio signal". Sixteen is used by subtractor 205 because it is equal to the smallest quantized audio signal magnitude which has an indefinite Huffman code signal in Huffman code memory 207.

Subtractor 205 sends to control sequencer 219 a signal indicating whether the diminished audio signal is negative or non-negative. When the diminished audio signal is negative it means that the quantized audio signal was completely and definitively encoded by Huffman code memory 207. When the diminished quantized audio signal is non-negative it means that the quantized audio signal was only partially encoded by Huffman code memory 207 and that register 217 contains an "indefinite Huffman code signal". Note that indefinite Huffman code signals represent the sign (+/−) of the corresponding quantized audio signal.

The diminished audio signal from subtractor 205 is fed into the address port of auxiliary code memory 211 where the corresponding output (i.e., the auxiliary code signal) is, under the direction of control sequencer 219, loaded into register 215. Auxiliary code memory 211 is illustratively an 1024-word by 15-bit random access memory ("RAM") or ROM but may comprise combinational logic. The contents of auxiliary code memory 211 are shown in TABLE 4.

advantageously comprises a "0" signal preceded by n "1" signals where $$n = \left[ \log_2 \left( \frac{e}{16} + 1 \right) \right],$$

e represents the magnitude of the diminished audio signal, $\log_2(x)$ denotes the base 2 logarithm of x and $[x]$ denotes the integer part of x. TABLE 5 presents a list of headers corresponding to magnitudes of e.

TABLE 5

Headers and Trailer Length as a Function of the Magnitude of the Diminished Audio Signal (Encoder)

| Range of e | n | Header Signal | Bits in Trailer |
|---|---|---|---|
| $0 \leq e \leq 15$ | 0 | 0 | 4 |
| $16 \leq e \leq 47$ | 1 | 10 | 5 |
| $48 \leq e \leq 111$ | 2 | 110 | 6 |
| $112 \leq e \leq 239$ | 3 | 1110 | 7 |
| $240 \leq e \leq 495$ | 4 | 11110 | 8 |
| $496 \leq e \leq 1007$ | 5 | 111110 | 9 |
| $16(2^n-1) \leq e < 16(2^{n+1}-1)-1$ | n | $1^n 0$ | n+4 |

The trailer within the auxiliary code signal is also based on the diminished audio signal e. A trailer is encoded as follows. The first 16 diminished audio signals 0, 1, 2, ... through 15 are represented with trailer 0000, 0001, 0010, through 1111, respectively. The next 32 diminished audio signals, 16, 17, ... through 47 are represented with trailer 00000, 00001, through 11111, respectively. The next 64 diminished audio signals, 48, 49, ... through 111 are represented with trailer 000000, 000001, 111111, respectively, and so on.

In general, as shown in TABLE 5, the diminished audio signals are divided into consecutive ranges, with the n-th range containing $2^{n+4}$ possible values, for n=0, 1, 2, ..., so that the smallest value in the n-th range is $16(2^n-1)$ and the largest value in the n-th range is $16(2^{n+1}-1)-1$.

A trailer in the n-th range is coded as an n+4 bit binary signal representing the position of the diminished

TABLE 4

Auxiliary Code Memory Contents (Encoder)

| Address | Contents |  |  |  |  |  |  |  |  |  |  |
|---|---|---|---|---|---|---|---|---|---|---|---|
| 0 through 15 | 000 | 00Y | YYY | YYY | YYY | through | 011 | 11Y | YYY | YYY | YYY |
| 16 through 47 | 100 | 000 | 0YY | YYY | YYY | through | 101 | 111 | 1YY | YYY | YYY |
| 48 through 111 | 110 | 000 | 000 | YYY | YYY | through | 110 | 111 | 111 | YYY | YYY |
| 112 through 239 | 111 | 000 | 000 | 00Y | YYY | through | 111 | 011 | 111 | 11Y | YYY |
| 240 through 495 | 111 | 100 | 000 | 000 | 0YY | through | 111 | 101 | 111 | 111 | 1YY |
| 496 through 1007 | 111 | 110 | 000 | 000 | 000 | through | 111 | 110 | 111 | 111 | 111 |

As shown in Table 4, the auxiliary code signal has a variable length although each memory location in auxiliary code memory 211 has a fixed length. To permit the auxiliary code signal to be delimited and defined within the fixed auxiliary code memory 207 word width, a "Y" in TABLE 4 represents a memory cell location which is not a part of the auxiliary code signal.

The auxiliary code signal advantageously comprises a variable length "header" concatenated with a variable length "trailer". The header within the auxiliary code signal serves two purposes. First, the header provides an indication of how many binary signals are in the trailer signal and second, the header partially represents the magnitude of the quantized audio signal. The header audio signal within its range. That is, if diminished audio signal e is in the n-th range, so that $$16(2^n-1) \leq e < 16(2^{(n+1)}-1),$$

then e is in the $e-16(2^n-1)$-th position (counting from 0) in its range, and the n+4 bit trailer represents $e-16(2^n-1)$.

For example, when the diminished audio signal e=23, e lies in the range from 16 through 47, so n=1, and e occupies the 7-th position in its range. The n+4 bit trailer representing 7 is 00111 and so the auxiliary code signal for e=23 is the concatenation of n 1's, a 0, and the n+4 bit trailer (i.e., 1000111).

We may re-express the auxiliary code signal representation scheme as follows: for a given diminished audio signal with magnitude, e, let n be as above, and let m denote the quanity $$2^{(2n+5)} - 2^{(n+5)} + e - 2^{(n+4)} + 16.$$

The auxiliary code signal corresponding to the diminished audio signal with magnitude e is the unsigned positioned fixed radix binary representation of m, preceded by 0 signals, if necessary, to assure that the auxiliary code signal comprises at least 5 binary signals.

For example, when e=23, n=1, and m=128−64+23−32+16=71, the unsigned positional fixed radix binary representation of 71 (1000111) is also the auxiliary code signal for e=23.

As an additional example, when e=5, n=0 and m=32−32+5−16+16=5, the unsigned positional fixed radix binary representation of 5 is 101. Because this has less than 5 binary signals it is padded with two preceding 0's to create the auxiliary code signal 00101.

Register 215 is advantageously a parallel-in/serial-out register (e.g., two SN74166 ICs) comprising memory sufficient to hold all 15 binary signals of the auxiliary audio signal output from auxiliary code memory 211. The auxiliary audio signal is loaded into register 215 such that the more significant binary signals of the compressed audio signal will be serially shifted out first.

Because the auxiliary code signal has a variable length, the illustrative embodiment advantageously comprises a mechanism for indicating to control sequencer 219 the length of the auxiliary code signal corresponding to the current quantized audio signal. As shown in FIG. 2, the diminished audio signal from subtractor 205 is fed into the address port of auxiliary length memory 213 where the corresponding output (which indicates the length of the auxiliary code signal held in register 215) is received by control sequencer 219. Auxiliary length memory 213 is illustratively a 1024 word by 4-bit random access memory ("RAM") or ROM. The contents of auxiliary code length memory 209 are shown in TABLE 6.

TABLE 6

| Auxiliary Code Length Memory Contents (Encoder) | |
|---|---|
| Address | Contents |
| 0 through 15 | 5 |
| 16 through 47 | 7 |
| 48 through 111 | 9 |
| 112 through 239 | 11 |
| 240 through 495 | 13 |
| 496 through 1007 | 15 |

It will be clear to persons having ordinary skill in the art of data communications how to take the address contents, given in decimal notation in TABLE 6, and convert them into a binary representation suitable for reception by control sequencer 219.

When (1) the Huffman code signal has been loaded into register 217, (2) the auxiliary code signal has been loaded into register 215, (3) the Huffman code length has been received by control sequencer 219, (4) the negative/non-negative signal from subtractor 205 has been received by control sequencer 219, and (5) the auxiliary code length has been received by control sequencer 219, then control sequencer 219 begins the process of outputting the compressed audio signal.

Control sequencer 219 simultaneously (1) enables register 217 to shift serially, directs multiplexor 221 to output the input from register 217, and (3) enables compressed audio signal register 223 to shift serially. Multiplexor 221 is advantageously a two-to-one multiplexor such as SN74157. Compressed audio signal register 223 is advantageously a 24-bit serial-in/serial-out shift register (e.g., three SN7491 8-bit serial-in/serial out shift registers) which is clocked by clock generator 206 and is enabled by control sequencer 219. The output of compressed audio signal register 223 is fed directly to communications channel/storage medium 106.

Next, control sequencer 219 shifts from register 217 through multiplexor 221 and into compressed audio signal register 223 exactly as many binary signals of the Huffman code signal as are indicated to control sequencer 219 by the Huffman code length. When the negative/non-negative signal is non-negative (meaning that the Huffman code signal just shifted into compressed audio signal register 223 is definitive), the auxiliary code signal in register 215 is not needed and control sequencer 219 has completed the encoding of the quantized audio signal. Control sequencer 219 begins the process of encoding the next quantized audio signal by disabling compressed audio signal register 223 and by asserting ACK 251.

When the negative/non-negative signal is negative (meaning that the Huffman code signal just shifted into compressed audio signal register 223 is indefinite), the auxiliary code signal in register 215 must be appended to the indefinite Huffman code signal in compressed audio signal register 223. In such case, control sequencer 219 simultaneously (1) enables auxiliary code register 215 to shift serially, directs multiplexor 221 to output the input from auxiliary code register 215, and (3) enables compressed audio signal register 223 to shift serially.

Next, control sequencer 219 shifts from auxiliary code register 215 through multiplexor 221 and into compressed audio signal register 223 exactly as many binary signals of the auxiliary code signal as are indicated to control sequencer 219 by the auxiliary code length. After this is completed, the encoding of the quantized audio signal is completed and control sequencer begins the process of encoding the next quantized audio signal by disabling the compressed audio signal register 223 and by asserting ACK 251.

For example: when a quantized audio signal is 11, the address to Huffman code memory 207 and Huffman code length memory 209 is "00 000 001 011" (the 11-bit two's complement encoding of +11). The Huffman code signal and the Huffman code length corresponding to the above address are "100 11" and "5", respectively. The rectified audio signal (i.e., the output of rectifier 203) is +11, the diminished audio signal (i.e., the output of subtractor 205) is −4, and the negative/non-negative signal indicates a negative diminished audio signal. When the diminished audio signal is negative the output of the auxiliary code memory 211 and auxiliary code length memory 213 are undefined and not needed for encoding the quantized audio signal. The compressed audio signal corresponding the quantized audio signal, 11, is the definitive Huffman code signal "100 11".

Another example: when a quantized audio signal is −33, the address to Huffman code memory 207 and Huffman code length memory 209 is "11 111 011 111" (the 11-bit two's complement encoding of −33). The Huffman code signal and the Huffman code length corresponding to that address are (from TABLE 2) "101 100 100" and "9", respectively. The rectified audio signal (i.e., the output of rectifier 203) is +33, the diminished audio signal (i.e., the output of subtractor 205) is +17, and the negative/non-negative signal indicates a non-negative diminished audio signal. The address to auxiliary code memory 211 and auxiliary code length memory 213 is an unsigned binary representation of +17. The auxiliary code signal is (from TABLE 4) "1 000 001" and the auxiliary code length is (from TABLE 5) "7", respectively. When the diminished audio signal is non-negative the the compressed audio signal is the concatenation of the indefinite Huffman code signal and the auxiliary code signal (in this example 101 100 100 100 000 1).

3. An Entropy Decoder

Entropy decoder 108, in accordance with the present invention, advantageously inputs a "compressed audio signal" output from communications channel/storage medium 106, decodes the compressed audio signal, and outputs a "reconstructed audio signal" to post-processor 110.

For clarity of explanation, illustrative embodiments of the present invention are presented as comprising electronic digital circuitry comprising transistor-transistor logic ("TTL"). The functions these circuits provide may alternately be provided by either shared or dedicated hardware, including, but not limited to, hardware capable of executing software. Illustrative embodiments may comprise digital signal processor (DSP) hardware, such as the AT&T DSP16 or DSP32C, and software performing the operations discussed below. Very large scale integration (VLSI) hardware embodiments of the present invention, as well as hybrid DSP/VLSI embodiments, may also be fabricated.

Illustrative entropy decoder 108 advantageously performs exactly the inverse function of entropy coder 104. It will be clear to persons of ordinary skill in the data communications field how to fabricate entropy decoders which perform the inverse function of embodiments of the present invention which encode signals.

Note, in accordance with the illustrative embodiment, the compressed audio signal output from entropy coder 104 may comprise one of the 33 "definitive Huffman code signals" which uniquely corresponds to one of the 33 quantized audio signals from +15 to −15 inclusive. Alternately, and also in accordance with the illustrative embodiment of the present invention, the compressed audio signal may comprise one of two "indefinite Huffman code signals" and an "auxiliary code signal" which together uniquely represent a quantized audio signal. Note that there is advantageously only one indefinite Huffman code signal ("111 00") corresponding to all ($2^{10}$-15) of the quantized audio signals in excess of +15 and only one indefinite Huffman code signal ("101 100 100") corresponding to all ($2^{10}$-14) of the quantized audio signals below −15.

Figure 3:
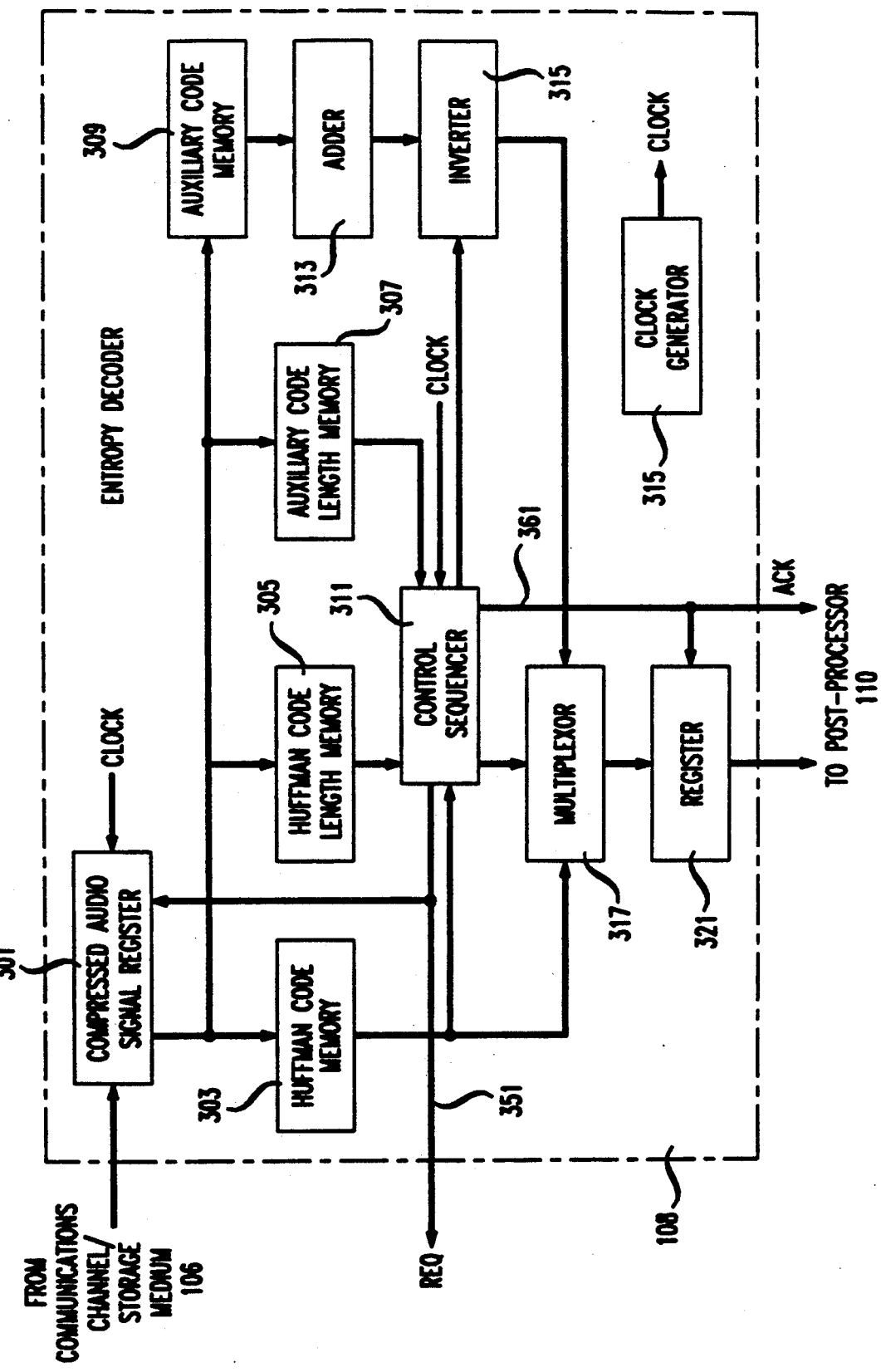
FIG. 3 presents an illustrative entropy decoder according to the present invention.

As is shown in FIG. 3, an illustrative entropy decoder 108 in accordance with the present invention advantageously comprises sequential and combinatorial digital circuitry. All of the sequential circuitry within entropy decoder 108 is synchronously clocked on the clock signal's positive edge as generated by clock generator 319.

When entropy decoder 108 is ready to accept one bit of a compressed audio signal from communications channel/storage medium 106, control sequencer 311 asserts REQ 351 for one clock cycle and enables compressed audio signal register 301 for one clock cycle to serially shift in one bit. Thereafter, control sequencer 311 disables compressed audio signal register 301 and retracts REQ 351. Control sequencer 311 illustratively comprises combinatorial digital circuitry and sequential circuitry. It will be clear to persons having ordinary skill in the art of data communications how to fabricate control sequencer 311. Compressed audio signal register 301 is advantageously a serial-in/parallel-out register (e.g., two SN74199 ICs) comprising memory sufficient to hold 15 binary signals of the compressed audio signal.

When control sequencer 311 is ready to begin processing a compressed audio signal, the 9 oldest binary signals of the compressed audio signal from compressed audio signal register 301 are fed into the address port of Huffman code memory 303 where the corresponding output (i.e., the "candidate reconstructed audio signal") is fed into control sequencer 311 and multiplexor 317. Huffman code memory 303 is illustratively a 512-word by 6-bit random access memory ("RAM") or ROM. The contents of Huffman code memory 303 are shown in TABLE 7.

TABLE 7

| Huffman Code Memory Contents (Decoder) | | | | | | |
|---|---|---|---|---|---|---|
| Address | | | Contents | | | |
| 000 | 0XX | XXX | 00 | 000 | 001 | 001 |
| 000 | 1XX | XXX | 00 | 000 | 000 | 111 |
| 001 | 0XX | XXX | 00 | 000 | 000 | 101 |
| 001 | 1XX | XXX | 00 | 000 | 000 | 010 |
| 010 | 000 | XXX | 11 | 111 | 110 | 100 |
| 010 | 001 | XXX | 11 | 111 | 111 | 010 |
| 010 | 01X | XXX | 00 | 000 | 001 | 110 |
| 010 | 1XX | XXX | 00 | 000 | 000 | 100 |
| 011 | 0XX | XXX | 00 | 000 | 000 | 011 |
| 011 | 10X | XXX | 11 | 111 | 111 | 111 |
| 011 | 110 | XXX | 11 | 111 | 111 | 001 |
| 011 | 111 | XXX | 11 | 111 | 110 | 110 |
| 100 | 00X | XXX | 11 | 111 | 111 | 101 |
| 100 | 01X | XXX | 00 | 000 | 001 | 111 |
| 100 | 10X | XXX | 00 | 000 | 001 | 100 |
| 100 | 11X | XXX | 00 | 000 | 001 | 011 |
| 101 | 0XX | XXX | 00 | 000 | 000 | 000 |
| 101 | 100 | 0XX | 11 | 111 | 110 | 010 |
| 101 | 100 | 100 | 10 | 111 | 110 | 000 |
| 101 | 100 | 101 | 11 | 111 | 110 | 001 |
| 101 | 100 | 110 | 11 | 111 | 110 | 011 |
| 101 | 100 | 111 | 11 | 111 | 110 | 101 |
| 101 | 101 | XXX | 11 | 111 | 110 | 111 |
| 101 | 11X | XXX | 00 | 000 | 001 | 010 |
| 110 | 0XX | XXX | 00 | 000 | 000 | 001 |
| 110 | 100 | XXX | 11 | 111 | 111 | 011 |
| 110 | 101 | XXX | 11 | 111 | 111 | 110 |
| 110 | 11X | XXX | 00 | 000 | 001 | 000 |
| 111 | 00X | XXX | 01 | 000 | 000 | 000 |
| 111 | 01X | XXX | 00 | 000 | 001 | 101 |
| 111 | 10X | XXX | 00 | 000 | 000 | 110 |
| 111 | 110 | XXX | 11 | 111 | 111 | 000 |
| 111 | 111 | XXX | 11 | 111 | 111 | 100 |

As shown in Table 7, an "X" in an address indicates that the address is valid for "X" equal to both "0" and "1" (e.g., address 111 00X XXX means all $2^4$ addresses between 111 000 000 and 111 111 111). The contents of each Huffman code memory 303 location are directly derivable by persons having ordinary skill in the field of data compression from TABLE 2 above.

Control sequencer 311 illustratively recognizes that the candidate reconstructed audio signal is definitive (i.e., uniquely and completely represents the reconstructed audio signal) by noting that both of the two most significant binary signals in the candidate reconstructed audio signal are either "0" or "1". When control sequencer 311 recognizes that the candidate reconstructed audio signal is definitive, control sequencer 311 directs multiplexor 317 to accept input from Huffman code memory 303, enables register 321 and loads the reconstructed audio signal into register 321.

Register 321 is advantageously a parallel-in/parallel-out register (e.g., two SN74199 ICs) comprising memory sufficient to hold all 11 binary signals of the reconstructed audio signal.

Because the compressed audio signal has a variable length, the illustrative embodiment advantageously comprises a mechanism for informing control sequencer 311 of the length of the compressed audio signal being processed. As shown in FIG. 3, the same 9-binary signals that are fed into Huffman code memory 303 are also fed into the address port of Huffman code length memory 305 where the corresponding output, the "Huffman code length" is received by control sequencer 311. The Huffman code length indicates the length of either the Huffman code signal held in register 301 and thus permits the variable length Huffman code signal to be properly parsed from the bitstream in register 301. Huffman code length memory 305 is illustratively a 512 word by 4-bit random access memory ("RAM") or ROM. The contents of Huffman code length memory 305 are shown in TABLE 8.

TABLE 8

Huffman Code Length Memory Contents (Decoder)

| Address | | | Contents |
|---|---|---|---|
| 000 | 0XX | XXX | 4 |
| 000 | 1XX | XXX | 4 |
| 001 | 0XX | XXX | 4 |
| 001 | 1XX | XXX | 4 |
| 010 | 000 | XXX | 6 |
| 010 | 001 | XXX | 6 |
| 010 | 01X | XXX | 5 |
| 010 | 1XX | XXX | 4 |
| 011 | 0XX | XXX | 4 |
| 011 | 10X | XXX | 5 |
| 011 | 110 | XXX | 6 |
| 011 | 111 | XXX | 6 |
| 100 | 00X | XXX | 5 |
| 100 | 01X | XXX | 5 |
| 100 | 10X | XXX | 5 |
| 100 | 11X | XXX | 5 |
| 101 | 0XX | XXX | 4 |
| 101 | 100 | 0XX | 7 |
| 101 | 100 | 100 | 9 |
| 101 | 100 | 101 | 9 |
| 101 | 100 | 110 | 9 |
| 101 | 100 | 111 | 9 |
| 101 | 101 | XXX | 6 |
| 101 | 11X | XXX | 5 |
| 110 | 0XX | XXX | 4 |
| 110 | 100 | XXX | 6 |
| 110 | 101 | XXX | 6 |
| 110 | 11X | XXX | 5 |
| 111 | 01X | XXX | 5 |
| 111 | 10X | XXX | 5 |
| 111 | 110 | XXX | 6 |
| 111 | 111 | XXX | 6 |
| 111 | 00X | XXX | 5 |

As shown in Table 8, an "X" in an address indicates that the address is valid for "X" equal to both "0" and "1" (e.g., address 111 00X XXX means all $2^4$ addresses between 111 000 000 and 111 111 111). It will be clear to persons having ordinary skill in the art of data communications how to take the address contents, given in decimal notation, and convert them into a binary representation suitable for reception by control sequencer 311.

Upon identifying the current Huffman code signal as either definitive (and loading the corresponding reconstructed audio signal into register 321) or as infinite, control sequencer 311 asserts REQ 351, enables compressed audio signal register 301 and shifts the signals in compressed audio signal register 301 as many binary signals as are indicated by the Huffman code signal length. This aligns either a new compressed audio signal (when the last Huffman code signal was definitive) or an auxiliary code signal (when the last Huffman code signal was indefinite) for processing in compressed audio signal register 301. Control sequencer 311 then retracts REQ 351 and disables compressed audio signal register. When the last Huffman code signal was definitive, control sequencer 311 begins anew the process of decoding the Huffman code signal in compressed audio signal register 301. When the last Huffman code signal was indefinite, control sequencer 311 must proceed to decode the auxiliary code signal held in compressed audio signal register 301 associated with the most previously received indefinite Huffman code signal.

Because the auxiliary code signal has a variable length, the illustrative embodiment advantageously comprises a mechanism for indicating to control sequencer 311 the length of the auxiliary code signal corresponding to the current compressed audio signal. As shown in FIG. 3, the 6 oldest binary signals in compressed audio signal register 301 are fed into the address port of auxiliary code length memory 307 where the corresponding output (which indicates the length of the auxiliary code signal held in compressed audio signal register 301) is received by control sequencer 311. Auxiliary code length memory 307 is illustratively a 32 word by 4-bit random access memory ("RAM") or ROM. The contents of auxiliary code length memory 307 are shown in TABLE 9.

TABLE 9

Auxiliary Code Length Memory Contents (Decoder)

| Address | | Contents |
|---|---|---|
| 0XX | XXX | 5 |
| 10X | XXX | 7 |
| 110 | XXX | 9 |
| 111 | 0XX | 11 |
| 111 | 10X | 13 |
| 111 | 110 | 15 |

As shown in Table 9, an "X" in an address indicates that the address is valid for "X" equal to both "0" and "1" (e.g., address 01X XXX means all $2^4$ addresses between 010 000 and 011 111). The contents of each auxiliary code length memory 307 location are derivable by persons having ordinary skill in the field of data compression from TABLE 4 and TABLE 5 above. It will be clear to persons having ordinary skill in the art of data communications how to take the address contents, given in decimal notation in TABLE 9, and convert them into a binary representation suitable for reception by control sequencer 311. After the current compressed audio signal is completely processed control sequencer 311 will use the auxiliary code length memory 307 output to shift compressed audio signal register 301 to be aligned with a new compressed audio signal.

The oldest 15 binary signals in compressed audio signal register 301 are fed into the 15 bit address port of auxiliary code memory 309 where the corresponding output (i.e., the auxiliary code signal) is fed into adder 313. Auxiliary code memory 309 is illustratively an 32,768 word by 10-bit random access memory ("RAM") or ROM but may comprise combinational logic. The contents of auxiliary code memory 309 are shown in TABLE 10.

TABLE 10

Auxiliary Code Memory Contents (Decoder)

| Address | | | | | | | | | | | Contents |
|---|---|---|---|---|---|---|---|---|---|---|---|
| 000 | 00X | XXX | XXX | XXX | through | 011 | 11X | XXX | XXX | XXX | 0 through 15 |
| 100 | 000 | 0XX | XXX | XXX | through | 101 | 111 | 1XX | XXX | XXX | 16 through 47 |
| 110 | 000 | 000 | XXX | XXX | through | 110 | 111 | 111 | XXX | XXX | 48 through 111 |
| 111 | 000 | 000 | 00X | XXX | through | 111 | 011 | 111 | 11X | XXX | 112 through 239 |
| 111 | 100 | 000 | 000 | 0XX | through | 111 | 101 | 111 | 111 | 1XX | 240 through 495 |
| 111 | 110 | 000 | 000 | 000 | through | 111 | 110 | 111 | 111 | 111 | 496 through 1007 |

As shown in Table 10, an "X" in an address indicates that the address is valid for "X" equal to both "0" and "1" (e.g., address 110 000 000 XXX XXX means all $2^4$ addresses between 110 000 000 000 000 and 110 000 000 111 111). Specifically, for example, the contents of all of the addresses (inclusive) from 000 000 000 000 000 to 000 001 111 111 111 should be 0. Additionally, the contents of all of the addresses (inclusive) from 011 110 000 000 000 to 011 111 111 111 111) should be 15. The contents of each auxiliary code memory 309 location are derivable by persons having ordinary skill in the field of data compression from TABLE 4 above. It will be clear to persons having ordinary skill in the art of data communications how to take the address contents, given in decimal notation in TABLE 10, and convert them into a binary representation suitable for reception by adder 313.

Adder 313 advantageously comprises combinatorial logic (e.g., three SN74188s) which takes the auxiliary code signal from auxiliary code memory 309 and augments it by 16 quanta to from an "augmented code signal". The augmented code signal is output from adder 313 and fed into inverter 313 which, conditionally and under direction of control sequencer 311, converts the unsigned augmented code signal into a negative two's complement representation of the augmented code signal (i.e., a reconstructed audio signal). Control sequencer 311 knows when to negate the augmented code signal because that information was contained in the negative indefinite Huffman code signal output from Huffman code memory 303.

Simultaneously control sequencer 311 directs multiplexor 317 to accept input from inverter 315, enables register 321 and loads the reconstructed audio signal into register 321. Control sequencer 311 then begins anew the process of decoding the Huffman code signal in compressed audio signal register 301.

What is claimed is:

1. An apparatus for generating a set of output signals based on a set of input signals, said apparatus comprising:
   means for forming
   (1) a first set of signals which partially represents said set of input signals;
   (2) a second set of signals which represents the number of signals in said first set of signals and which partially represents said set of input signals; and
   (3) a third set of signals indicating the significance of said first set of signals and said second set of signals; and
   means for generating said set of output signals based on said first set of signals, said second set of signals and said third set of signals such that said set of output signals represents said set of input signals.

2. The apparatus of claim 1 wherein said set of input signals has a polarity and said third set of signals additionally represents said polarity of said set of input signals.

3. The apparatus of claim 1 wherein said third set of signals partially represents the magnitude of said set of input signals.

4. The apparatus of claim 1 wherein said third set of signals has three signals more than the number of signals in said second set of signals.

5. The apparatus of claim 1 wherein the signals of said set of input signals, said set of output signals, said first set of signals, said second set of signals and said third set of signals are binary signals.

6. The apparatus of claim 1 wherein said second set of signals and said third set of signals are uniquely decodable.

7. The apparatus of claim 1 further comprising:
   means for forming a set of magnitude signals based on the absolute magnitude of said set of input signals; and
   means for subtracting a predetermined quantity from said set of magnitude signals.

8. A method for generating a set of output signals based on a set of input signals comprising the steps of:
   forming
   (1) a first set of signals which partially represents said set of input signals;
   (2) a second set of signals which represents the number of signals in said first set of signals and which partially represents said set of input signals; and
   (3) a third set of signals indicating the significance of said first set of signals and said second set of signals; and
   generating said set of output signals based on said first set of signals, said second set of signals and said third set of signals such that said set of output signals represents said set of input signals.

9. The method of claim 8 wherein said set of input signals has a polarity and said third set of signals additionally represents said polarity of said set of input signals.

10. The method of claim 8 wherein said third set of signals partially represents the magnitude of said set of input signals.

11. The method of claim 8 wherein said third set of signals has three signals more than the number of signals in said second set of signals.

12. The method of claim 8 wherein the signals of said set of input signals, said set of output signals, said first set of signals, said second set of signals and said third set of signals are binary signals.

13. The method of claim 8 wherein said second set of signals and said third set of signals are uniquely decodable.

14. The method of claim 8 further comprising the steps of:
   forming a set of magnitude signals based on the absolute magnitude of said set of input signals; and
   subtracting a predetermined quantity from said set of magnitude signals.

* * * * *